(12) United States Patent
Saito et al.

(10) Patent No.: US 8,138,011 B2
(45) Date of Patent: Mar. 20, 2012

(54) RADIATION-DETECTING DEVICE AND METHOD OF MANUFACTURING SAME

(75) Inventors: Tatsuya Saito, Kawasaki (JP); Ryoko Horie, Yokohama (JP); Nobuhiro Yasui, Yokohama (JP); Toru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/072,579

(22) Filed: Mar. 25, 2011

(65) Prior Publication Data

US 2011/0248366 A1 Oct. 13, 2011

(30) Foreign Application Priority Data

Apr. 7, 2010 (JP) .................................. 2010-088795

(51) Int. Cl.
*H01L 21/00* (2006.01)
(52) U.S. Cl. ........................................................ 438/69
(58) Field of Classification Search ........................ None
See application file for complete search history.

(56) References Cited

U.S. PATENT DOCUMENTS

2010/0173445 A1* 7/2010 Danzer et al. .................. 438/69

FOREIGN PATENT DOCUMENTS

JP 2000-075038 A 3/2000

\* cited by examiner

*Primary Examiner* — Charles Garber
*Assistant Examiner* — Andre' C Stevenson
(74) *Attorney, Agent, or Firm* — Canon U.S.A., Inc. IP Division

(57) ABSTRACT

A method of manufacturing a radiation-detecting device including spaced first columnar scintillators, second columnar scintillators which are located between the neighboring first columnar scintillators and which are spaced from the first columnar scintillators, and photodetecting elements overlapping with the first columnar scintillators includes a step of preparing the substrate such that the substrate has a surface having an uneven section having protruding portions and a plurality of spaced flat sections surrounded by the uneven section and also includes a step of forming the first columnar scintillators and the second columnar scintillators on the flat sections and the protruding portions, respectively, by depositing a scintillator material on the substrate having the uneven section and the flat sections. The uneven section has recessed portions and satisfies the following inequality:

$h/d \geq 1$ where h is the depth of each recessed portion and d is the distance between the protruding portions.

6 Claims, 5 Drawing Sheets

RADIATION-DETECTING DEVICE AND METHOD OF MANUFACTURING SAME

BACKGROUND OF THE INVENTION

1. Field of the Invention

The present invention relates to a radiation-detecting device for detecting radiation and a method of manufacturing the radiation-detecting device.

2. Description of the Related Art

In radiography, an image is obtained when radiation is applied to a subject and the radiation passing therethrough is detected by a radiation detector. In digital radiography (DR), an image is obtained by converting the detected radiation into electrical signals and digitizing the electric signal with a DR detector. To that end, in DR, a flat panel detector (FPD) which detects radiation and converts the radiation into electrical signals is usually used. The FPD includes two-dimensionally arranged photodetecting elements (e.g., photodetectors) and a scintillator layer overlying the photodetecting elements. The operation principle of the FPD is as follows: light (scintillation light) emitted from the scintillator layer irradiated with radiation is detected and is converted into electrical signals with the photodetecting elements, which are made of amorphous or polycrystalline silicon, and the electrical signals are processed into an image with digital circuitry connected to the photodetecting elements. The scintillator layer of the FPD is made of a commonly known material such as $Gd_2O_2S$:Tb prepared by doping an oxysulfide of gadolinium with terbium, which serves as a luminescent center. Alternatively, the scintillator layer can be made of CsI:Tl prepared by doping cesium iodide with thallium. In particular, an FPD containing CsI:Tl is useful in obtaining high resolution because the CsI:Tl layer is formed by vacuum vapor deposition so as to have a plurality of independent columnar crystals and therefore so-called crosstalk is reduced by a light-guiding effect in the columnar crystals.

Japanese Patent Laid-Open No. 2000-75038 discloses a radiation image sensor including a photodiode array including two-dimensionally arranged photodetectors and columnar scintillators. The columnar scintillators are disposed on the photodetectors in a one-to-one correspondence thereto and in spaces between neighboring photodetectors. The columnar scintillators which are disposed between the neighboring photodetectors are smaller in size than the columnar scintillators disposed on the photodetectors.

In Japanese Patent Laid-Open No. 2000-75038, in order to obtain the above-described configuration, columnar scintillators smaller in size than the photodetectors are uniformly formed on the photodetectors and in a space between the neighboring photodetectors. Then, the columnar scintillators disposed on the photodetectors are formed in such a manner that the small-sized columnar scintillators disposed on the photodetectors are irradiated with a laser beam so as to be fused with each other. As a result, columnar scintillators of substantially equal size to the photodetectors are disposed on each photodetector in a one-to-one relationship thereto, and columnar scintillators smaller in size are disposed between neighboring photodetectors. The technique of fusing the small columnar scintillators with each other with a laser beam, however, damages the scintillators disposed on the photodetectors and therefore can be detrimental to image quality.

SUMMARY OF THE INVENTION

The present invention provides a method of manufacturing a high-resolution radiation-detecting device having reduced crosstalk without damaging any scintillator.

A method of manufacturing a radiation-detecting device that includes a substrate including a plurality of first columnar scintillators spaced from each other and a plurality of second columnar scintillators which are located between the neighboring first columnar scintillators and which are spaced from the first columnar scintillators adjacent thereto and also includes a plurality of photodetecting elements each located at a position overlapping with a corresponding one of the first columnar scintillators includes: a step of preparing the substrate such that the substrate has a surface having an uneven section having protruding portions and a plurality of flat sections which are surrounded by the uneven section and which are spaced from each other and a step of forming the first columnar scintillators and the second columnar scintillators on the flat sections and the protruding portions, respectively, by depositing a scintillator material on the substrate having the uneven section and the flat sections. The uneven section has recessed portions and satisfies the following inequality:

$$h/d \geq 1$$

where h is the depth of each recessed portion and d is the distance between the protruding portions.

A radiation-detecting device includes a substrate including a plurality of first columnar scintillators spaced from each other and a plurality of second columnar scintillators which are located between the neighboring first columnar scintillators and which are spaced from the first columnar scintillators adjacent thereto and also includes a plurality of photodetecting elements each located at a position overlapping with a corresponding one of the first columnar scintillators. The substrate has a surface having an uneven section having recessed portions and protruding portions and a plurality of flat sections which are surrounded by the uneven section and which are spaced from each other. The first columnar scintillators are located on the flat sections. The second columnar scintillators are located on the protruding portions. The uneven section satisfies the following inequality:

$$h/d \geq 1$$

where h is the depth of each recessed portion and d is the distance between the protruding portions.

According to the present invention, a high-resolution radiation-detecting device having reduced crosstalk can be provided. The high-resolution radiation-detecting device can be manufactured without damaging any scintillator.

Further features of the present invention will become apparent from the following description of exemplary embodiments with reference to the attached drawings.

DESCRIPTION OF THE EMBODIMENTS

Preferred embodiments of the present invention will now be described with reference to the attached drawings.

Figure 1A:
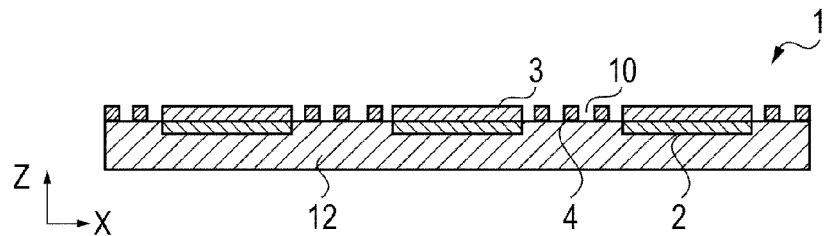
FIG. 1A is an illustration showing a step of preparing a substrate having an uneven section and a plurality of flat sections.
Figure 1B:
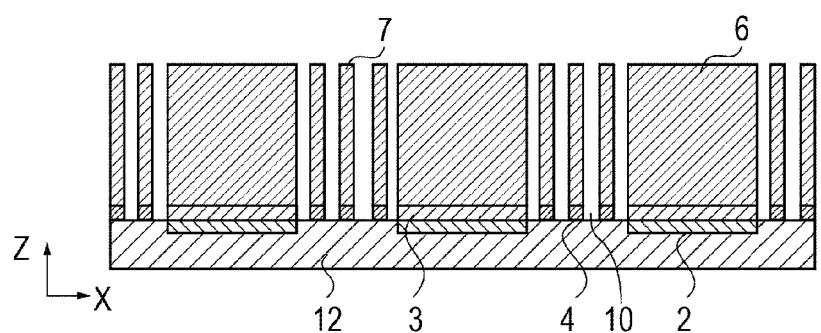
FIG. 1B is an illustration showing a step of forming first columnar scintillators and second columnar scintillators.
Figure 1C:
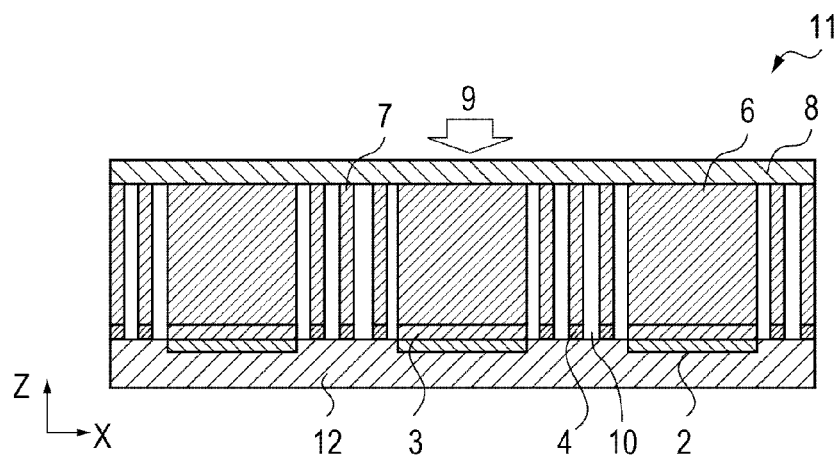
FIG. 1C is a sectional view of a radiation-detecting device according to an embodiment of the present invention.
Figure 1D:
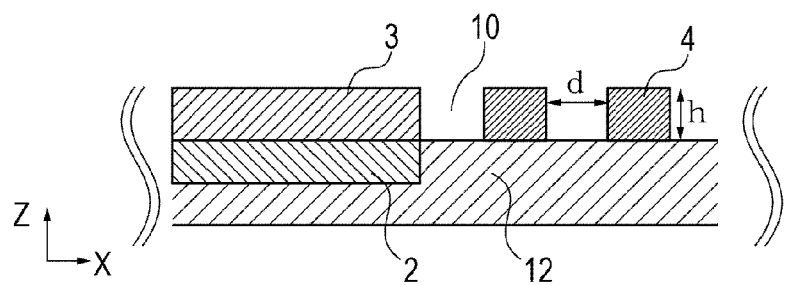
FIG. 1D is an enlarged view of the flat sections and uneven section shown in FIG. 1A.

FIGS. 1A to 1D are illustrations showing steps of a method of manufacturing a radiation-detecting device 11 according to an embodiment of the present invention, and the radiation-detecting device 11. In particular, FIG. 1A shows a step of preparing a substrate 1 with and uneven section and a plurality of flat sections 3 formed on a surface of the substrate. The flat sections 3 are surrounded by the uneven section and are spaced from each other so as to form a one or two dimensional array. The uneven section that surrounds and separates the flat sections 3 is formed by a plurality protruding portions 4 and recessed portions 10. FIG. 1B shows a step of forming first columnar scintillators 6 and second columnar scintillators 7 on the flat sections 3 and the protruding portions 4, respectively, by depositing a scintillator material on the substrate 1. FIG. 1C shows the radiation-detecting device 11 resulting from the previous steps. With reference to FIG. 1C, an additional film 8, which is preferably used, including a protective layer and a reflective layer overlies the first and second columnar scintillators 6 and 7. FIG. 1D is an enlarged view showing a sectional cut of the substrate on which the flat sections 3 and the uneven section are formed on a surface thereof, which is shown in FIG. 1A.

With reference to FIG. 1C, the radiation-detecting device 11 includes the substrate 1. The substrate 1 includes the first and second columnar scintillators 6 and 7 respectively on the flat sections 3 and protruding portions 4. The first columnar scintillators 6 are spaced from each other by a space occupied by the second columnar scintillators 7. The second columnar scintillators 7 are located between neighboring first columnar scintillators 6 and are spaced from the first columnar scintillators 6 nearest thereto. The radiation-detecting device 11 further includes a plurality of photodetecting elements 2 that are each located at a position overlapping with a corresponding one of the first columnar scintillators 6. Since the photodetecting elements 2 are located at the positions overlapping with the first columnar scintillators 6 and the neighboring first columnar scintillators 6 are spaced from each other, crosstalk between the photodetecting elements 2 can be efficiently reduced. In particular, it should be noted that most of scintillation light emitted from each first columnar scintillator 6 irradiated with an X-ray 9, which is a form of radiation, is confined in the first columnar scintillator 6 because of the difference between the refractive index of the first columnar scintillator 6 and the refractive index of a space surrounding the first columnar scintillator 6. This is called a light-guiding effect. This effect allows most of the scintillation light emitted from the first columnar scintillator 6 to reach the photodetecting element 2, which are located at the positions overlapping with the first columnar scintillator 6, and prevents most of the scintillation light emitted therefrom from reaching the photodetecting elements 2 neighboring to the first columnar scintillator 6.

The presence of the second columnar scintillators 7, which are located between the first columnar scintillators 6 and are spaced from the first columnar scintillators 6 nearest thereto, allows crosstalk between the photodetecting elements 2 to be further reduced. In particular, a slight amount of scintillation light (hereinafter referred to as leaking light in some cases) leaking from each first columnar scintillator 6 towards the photodetecting elements 2 located nearest thereto enters the second columnar scintillators 7 and is refracted. Specifically, since several second columnar scintillators 7 surround each first columnar scintillator 6, any scintillation light leaking from the scintillators 6 is repeatedly refracted and therefore is reduced in energy. Most of leaking light entering the second columnar scintillators 7 is lost in energy by the second columnar scintillators 7 and therefore is unlikely to reach the photodetecting elements 2 nearest thereto. Scintillation light emitted from the second columnar scintillators 7 is confined therein by the light-guiding effect of the second columnar scintillators 7 and therefore is prevented from reaching the photodetecting elements 2. A slight amount of scintillation light leaking from each second columnar scintillator 7 enters the second columnar scintillators 7 nearest thereto, is reduced in energy, and therefore is unlikely to reach the photodetecting elements 2 located nearby.

The radiation-detecting device 11 is capable of reducing crosstalk as described above. A method of manufacturing the radiation-detecting device 11 without damaging any scintillator is described below with reference to the drawings.

In this embodiment, the substrate 1 is prepared so as to have the uneven section and the flat sections 3, which are surrounded by the uneven section and are spaced from each other, as shown in FIG. 1A. The uneven section and the flat sections 3 are formed in such a manner that a member for forming the uneven section and the flat sections 3 is provided over a base member 12 and is then patterned by a process such as lithography. The uneven section is formed with protruding portions 4 and recessed portions 10 as shown in FIG. 1D and satisfies the inequality $h/d \geq 1$, where h is the depth (hereinafter simply referred to as the recessed portion depth h in some cases) of each recessed portion 10 and d is the distance (hereinafter simply referred to as the protruding portion-to-protruding portion distance d in some cases) between the neighboring protruding portions 4. The scintillator material is deposited on the substrate 1 having the uneven section and the flat sections 3 as shown in FIG. 1B. A process such as vacuum vapor deposition can be used to deposit the scintillator material on the substrate 1. Since the recessed portions 10 are arranged on the substrate 1 such that the depth h of each recessed portion 10 and the distance d between the neighboring protruding portions 4 satisfy the inequality $h/d \geq 1$, the scintillator material is not provided in the recessed portions 10. In other words, satisfying the inequality $h/d \geq 1$ allows for the first columnar scintillators 6 and the second columnar scintillators 7 to be formed on the flat sections 3 and the protruding portions 4, respectively, without depositing scintillator material in the recessed portions 10. In particular, since substrate 1 has the uneven section, which satisfies the inequality $h/d \geq 1$, and therefore the scintillator material is primarily deposited on the protruding portions 4 and the flat sections 3 in an initial stage of depositing the scintillator material on the substrate 1, portions of the scintillator material deposited on the protruding portions 4 and the flat sections 3 begin to shield the recessed portions 10 from the scintillator material immediately after the scintillator material is deposited on the substrate 1. Since this shielding phenomenon proceeds with time, the scintillator material cannot reach the recessed portions 10 in a short time and therefore the recessed portions 10 are not filled with the scintillator material. This results in that the first columnar scintillators 6 and the second columnar scintillators 7 are formed on the flat sections 3 and the protruding portions 4, respectively, so as to be spaced from each other with the recessed portions 10 disposed therebetween.

According to this embodiment, the scintillator material is not processed by laser irradiation or the like, but it is controllably deposited (e.g., grown) on the respective flat sections 3 and protruding portions 4. Therefore the first columnar scintillators 6, which are located at the positions overlapping with the photodetecting elements 2 and are spaced from each other, and the second columnar scintillators 7, which are located between the neighboring first columnar scintillators 6 and are spaced from the first columnar scintillators 6, can be formed without damaging any scintillator.

The first columnar scintillators 6 are not crystallized into columns but are preferably formed as solid columns so as to be bulky. This increases the density of the first columnar scintillators 6 per unit area on the substrate 1. In turn, the scintillation light traveling from the scintillators 6 towards the photodetecting elements 2 corresponding thereto can be efficiently increased. In order that the first columnar scintillators 6 are formed so as to be bulky, conditions for depositing the scintillator material on the substrate 1 may be controlled such that uniform diffusion of the scintillator material on the substrate 1 is promoted. In particular, the temperature of the substrate 1 and the pressure of the gas (introduced gas) used in the depositing (growth) process may be controlled when the scintillator material is deposited on the substrate 1. The increase in temperature of the substrate 1 and the reduction in pressure of the process gas allow the first columnar scintillators 6 to be solid and bulky. In the case where the diffusion of the scintillator material on the substrate 1 is excessively promoted, the first columnar scintillators 6 disposed on the flat sections 3 may be brought into contact and fused with the second columnar scintillators 7 disposed on the protruding portions 4. Therefore, the degree of promoting the diffusion of the scintillator material needs to be appropriately controlled. More specifically, as noted above, conventional scintillators are formed by a technique in which closely spaced columnar scintillators are fused with each other by laser irradiation such that spaces therebetween are eliminated. This conventional technique is considered disadvantageous because the fusing may not be uniform and may instead damage the scintillating material. In contrast, bulky scintillators which are formed by the method according to this embodiment in such a manner that conditions for depositing the scintillator material on the substrate 1 are controlled are more preferable because the density of the scintillator material is high and transfer of scintillation light is increased.

The flat sections 3 preferably have an area equal to or greater than the area of each photodetecting element 2. This allows the first columnar scintillators 6 corresponding to the photodetecting elements 2 to have an increased area; hence, scintillation light traveling toward the photodetecting elements 2 can be increased.

The distance d between the protruding portions 4 may range preferably from 2 μm to 10 μm inclusive, and the periodicity of the protruding portions 4 is preferably between 5 μm to 15 μm.

Figure 2A:
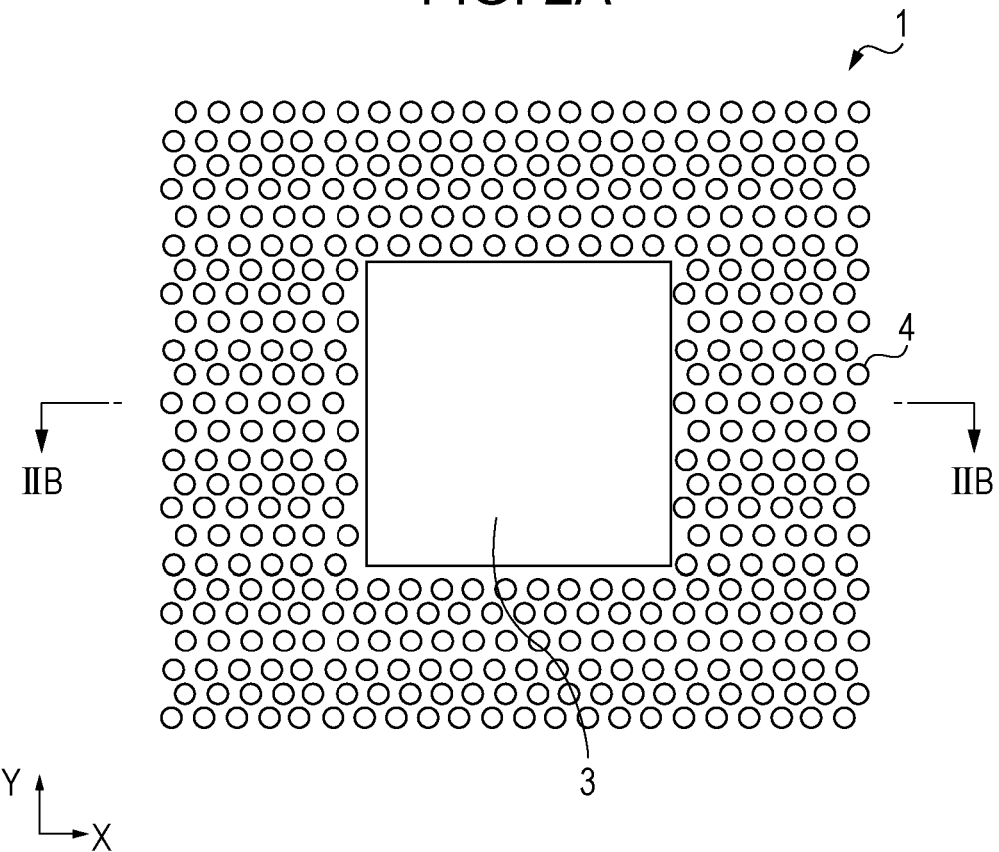
FIG. 2A is a top view of a substrate used in an example of the present invention.

The protruding portions 4 are preferably located between the neighboring flat sections 3 and the protruding portions 4 are preferably alternately arranged. As used herein, alternately arranged, is intended to mean that the protrusions 4 are not arranged to form orthogonal rows and columns, but instead are arranged in rows that are offset from each other (as shown in FIG. 2A). This offset arrangement allows crosstalk to be securely reduced, because even if light leaks from the first columnar scintillators 6, the leaking light enters the second columnar scintillators 7 with increased probability and the number of times the leaking light is refracted is large.

Figure 2B:
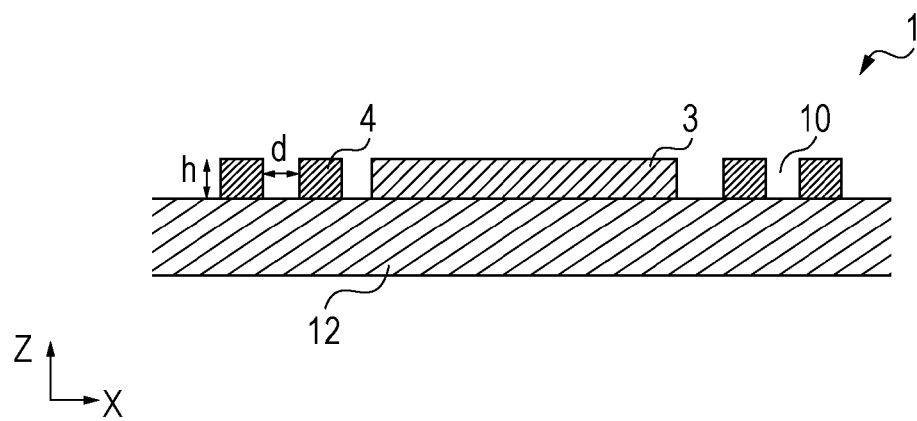
FIG. 2B is a sectional view of the substrate taken along the line IIB-IIB of FIG. 2A.

The substrate 1 having the flat sections 3 and the uneven section is not limited to a configuration shown in FIG. 1A. Examples of the substrate 1 having the flat sections 3 and the uneven section include a substrate 1 having flat sections 3 and protruding portions 4 described in an example below with reference to FIGS. 2A and 2B. Specifically, as shown in FIG. 2B, substrate 1 includes a base member 12 having protruding portions 4 and flat sections 3 which are equal in height to each other and which are formed by providing desired grooves or dotted pits in a surface of the base member 12. That is, a substrate 1 having an uneven section and flat sections 3 can be obtained by processing the base member 12, for example, through lithographic patterning.

The additional film 8, which includes the protective layer and the reflective layer, may be provided over the first and second columnar scintillators 6 and 7 as shown in FIG. 1C. The protective layer of the additional film 8 may be an organic layer capable of protecting the first and second columnar scintillators 6 and 7. The reflective layer of the additional film 8 may be an aluminum layer reflecting scintillation light that is emitted from each scintillator irradiated with the X-ray radiation 9, which is radiation, to travel away from the photodetecting elements 2.

In this embodiment, the photodetecting elements 2 are located on the side of the surface of the substrate 1 that has the uneven section and the flat sections 3. The photodetecting elements 2 are not limited to such a configuration and may be located on the side of a surface opposite to the surface of the substrate 1 that has the uneven section and the flat sections 3. Alternatively, the photodetecting elements 2 may be spaced from the substrate 1 or may be located on another substrate.

The radiation-detecting device 11 preferably further includes a protective film for protecting the photodetecting elements 2 and/or thin-film transistors (TFTs) each arranged to correspond to a corresponding one of the photodetecting elements 2.

Two samples used to describe examples of the present invention are described below.

Sample 1

Flat sections 3 and protruding portions 4 are provided on a base member 12 made of quartz, whereby a substrate 1 having the flat sections 3 and an uneven section is prepared. In particular, a photoresist (SU-8 3005 distributed in the U.S. by MicroChem Corp. of Newton Mass.) is applied to the base member 12 by a spin coating process so as to form a layer with a thickness of 4 μm. After being heated to 95° C. on a hotplate, the base member 12 coated with the photoresist is exposed to light through a mask having a pattern corresponding to the flat sections 3 and the protruding portions 4. The base member 12 having the exposed photoresist is heated to 95° C. and the exposed photoresist is then developed with a developing solution (developer) for SU-8. The base member 12 having a pattern formed by developing the photoresist is finally baked at 120° C., whereby the flat sections 3 and the protruding portions 4 are formed on the base member 12. The substrate 1 having the uneven section and flat sections 3 formed as described above is shown in FIGS. 2A and 2B. The flat sections 3 are surrounded by the uneven section and are spaced from each other. FIG. 2A is a top view of the substrate 1. FIG. 2B is a sectional view of the substrate 1 taken along the line IIB-IIB of FIG. 2A. The flat sections 3 and the protruding portions 4 are shown in FIG. 2B at a scale different from that used in FIG. 2A for the purpose of a better understanding of the present invention. In this sample, the flat sections 3 are of a rectangular parallelepiped shape, have a height of 3 µm (in a Z-direction in FIG. 2A) from a surface of the base member 12, and each have an upper surface having sides with a length of 50 µm (an X-direction and Y-direction in FIG. 2A); the protruding portions 4 are of a cylindrical shape, have a height h of 3 µm (the depth of recessed portions 10) from the base member 12, and each have an upper surface having a diameter of 3 µm; and the distance d between the neighboring protruding portions 4 is 2 µm. The protruding portions 4 are alternately arranged between the neighboring flat sections 3. This allows the substrate 1 to be prepared. The substrate 1 has the protruding portions 4 and the flat sections 3, which are arranged on the base member 12, and also has the uneven section. The flat sections 3 are surrounded by the uneven section and are spaced from each other.

Figure 3:
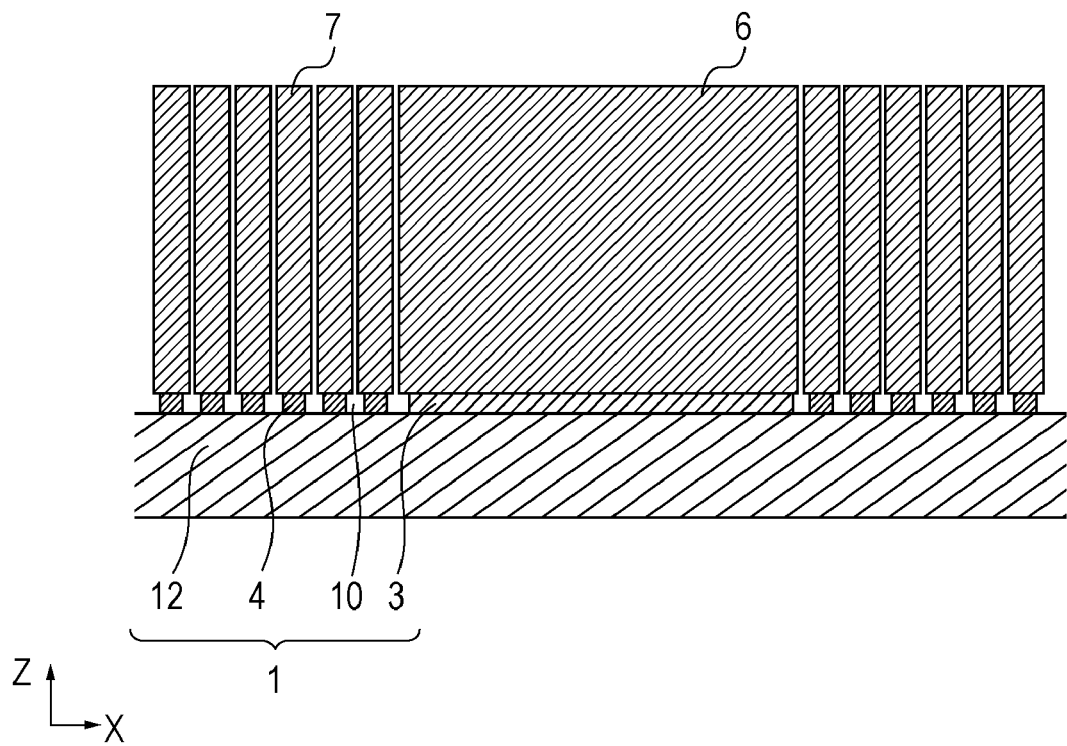
FIG. 3 is an illustration showing a state that scintillators are disposed on the substrate shown in FIGS. 2A and 2B.

The substrate 1 is placed into a chamber and a scintillator material containing CsI:Tl is then deposited on the substrate 1 by a vacuum vapor deposition process. In particular, a powder of CsI and a powder of TlI are each placed into a boat for vapor deposition and the boat containing the CsI powder and the boat containing the TlI powder are heated to 700° C. and 300° C., respectively, whereby CsI and TlI are co-deposited on the substrate 1. In this step, the temperature of the substrate 1 is adjusted to 200° C., an Ar gas is introduced into the chamber, and the pressure of an Ar gas is adjusted to $5 \times 10^{-3}$ Pa. Furthermore, the deposition rate of CsI and that of TlI are controlled such that the content of Tl in a layer of CsI:Tl deposited on the substrate 1 is about one mole percent and the thickness of the CsI:Tl layer is 200 µm. As shown in FIG. 3, first columnar scintillators 6 and second columnar scintillators 7 are formed on the flat sections 3 and the protruding portions 4, respectively, which are arranged on the substrate 1.

The above conditions allow the first columnar scintillators 6 to be formed on the flat sections 3 such that the first columnar scintillators 6 are bulky and also allow the second columnar scintillators 7 to be formed on the protruding portions 4 such that the recessed portions 10 disposed between the neighboring protruding portions 4 are not filled with the scintillator material and the second columnar scintillators 7 are spaced from each other. Although the second columnar scintillators 7 are slightly greater in diameter than the protruding portions 4, the neighboring second columnar scintillators 7 are not in contact with each other, and are not in contact with the first columnar scintillators 6.

Sample 2

This sample is an example using a pattern having an uneven section and flat sections 3 different from those of Sample 1.

Figure 4A:
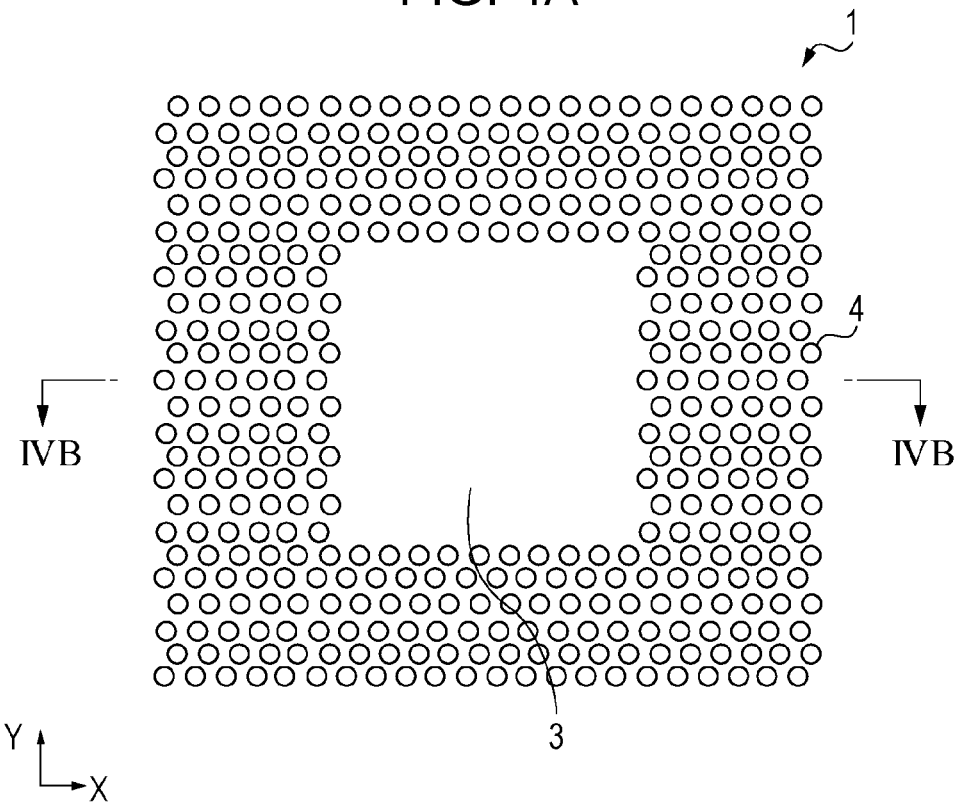
FIG. 4A is a top view of a substrate used in another example of the present invention.
Figure 4B:
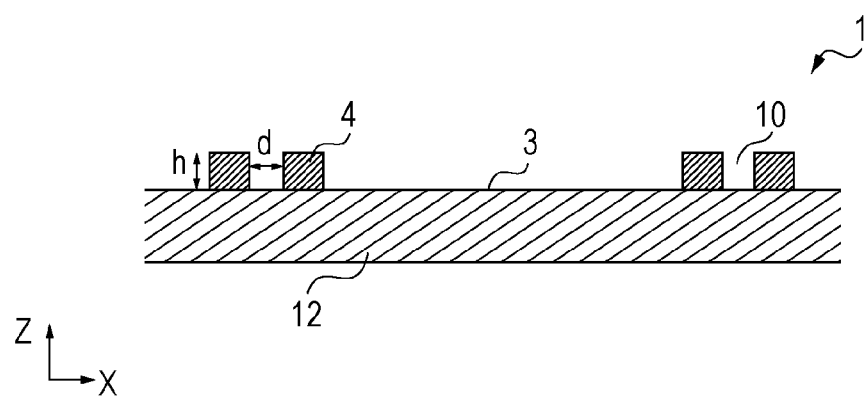
FIG. 4B is a sectional view of the substrate taken along the line IVB-IVB of FIG. 4A.

Protruding portions 4 are formed on a base member 12 made of quartz using a photoresist (SU-8 3005) in substantially the same manner as that used to prepare Sample 1. In sample 2, however, a mask having a pattern different from that used to prepare Sample 1 is used to form the protruding portions 4 as shown in FIGS. 4A and 4B. FIG. 4A is a top view of the substrate 1. FIG. 4B is a sectional view of the substrate 1 taken along the line IVB-IVB of FIG. 4A. The flat sections 3 and the protruding portions 4 are shown in FIG. 4B at a scale different from that used in FIG. 4A for the purpose of a better understanding of the present invention. In this sample, the flat sections 3 are each arranged in a region which is surrounded by an uneven section including the protruding portions 4 and recessed portions 10 in which the base member 12 is partly exposed as shown in FIGS. 4A and 4B. In other words, portions of the photoresist (SU-8 3005) that correspond to the flat sections 3 of Sample 1 are removed such that the flat sections 3 are formed so as to be parts of the base member 12. The flat sections 3 are 50 µm square. The protruding portions 4 are of a cylindrical shape, have a height h of 3 µm (that is, the depth of recessed portions 10 is 3 µm). Each protrusion portion 4 has an upper surface having a diameter of 3 µm. The distance d between the neighboring protruding portions 4 is at least 2 µm. The protruding portions 4 are alternately arranged (offset at least in one direction), and formed in a space between neighboring flat sections 3. A substrate 1 is prepared as described above. The substrate 1 has the protruding portions 4, which are arranged on the base member 12, the uneven section, and the flat sections 3, which are surrounded by the uneven section and are spaced from each other.

Figure 5:
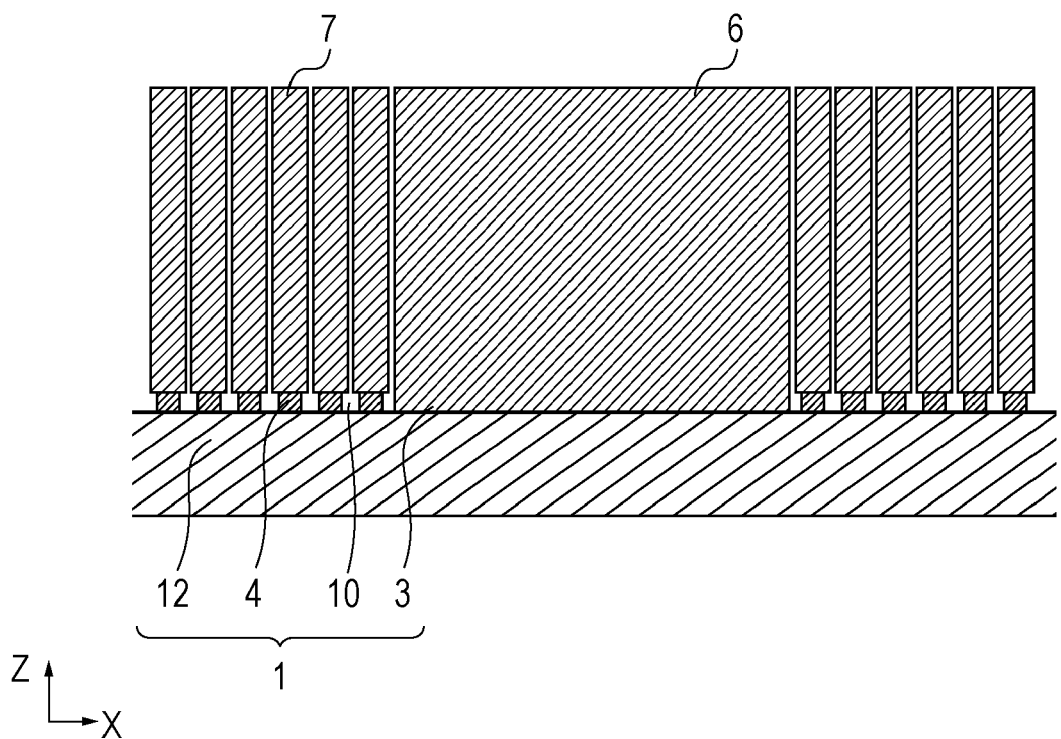
FIG. 5 is an illustration showing a state that scintillators are disposed on the substrate shown in FIGS. 4A and 4B.

The substrate 1 is placed into a chamber and a scintillator material containing CsI:Tl is then deposited on the substrate 1 by a vacuum vapor deposition process in substantially the same manner as that used to prepare Sample 1, whereby first columnar scintillators 6 and second columnar scintillators 7 are formed on the flat sections 3 and the protruding portions 4, respectively, which are arranged on the substrate 1 as shown in FIG. 5.

In this sample, the first columnar scintillators 6, which are disposed on the flat sections 3, are bulky. The flat sections 3 are recessed and are, however, not recesses with an aspect ratio of 1 or more unlike the recessed portions 10 of the uneven section; hence, the scintillator material is deposited on the flat sections 3 and therefore the first columnar scintillators 6 are formed so as to be bulky. The second columnar scintillators 7 are arranged on the protruding portions 4 so as to be spaced from each other such that the recessed portions 10 between the neighboring protruding portions 4 are not filled with the scintillator material. The neighboring first and second columnar scintillators 6 and 7 are spaced from each other. Through the above steps, the first and second columnar scintillators 6 and 7, which are spaced from each other, can be formed without being damaged.

EXAMPLES

Example 1

In this example, a radiation-detecting device shown in FIG. 1 was manufactured using steps of preparing Sample 1.

Polyimide was provided on a substrate 1 having two-dimensionally arrayed photodetecting elements 2 made of amorphous silicon and was then patterned into the same pattern as that used to prepare Sample 1 shown in FIG. 2A, whereby flat sections 3 and protruding portions 4 were formed. In this step, the pattern is formed such that the flat sections 3 shown in FIG. 2B were arranged on the photodetecting elements 2. A scintillator material containing CsI:Tl was deposited on the substrate 1 in substantially the same manner as that used to prepare Sample 1, whereby first columnar scintillators 6 and second columnar scintillators 7 were formed on the flat sections 3 and the protruding portions 4, respectively. A polyparaxylene film serving as a moisture-proof protective film was provided over the first and second columnar scintillators 6 and 7. An aluminum film serving as a reflective film was attached to the polyparaxylene film by a hot melt process. Through the above steps, the radiation-detecting device could be manufactured without damaging any scintillator. The radiation-detecting device included the first and second columnar scintillators 6 and 7. The first columnar scintillators 6 were each located at a position overlapping with a corresponding one of the photodetecting elements 2. The second columnar scintillators 7 were located between the neighboring first columnar scintillators 6 and were spaced from the first columnar scintillators 6 adjacent thereto.

In the case of using steps of preparing Sample 2, a pattern may be formed such that the flat sections 3 shown in FIG. 4B are arranged on the photodetecting elements 2.

Example 2

In this example, a radiation-detecting device was manufactured using steps of preparing Sample 1.

An aluminum film serving as a reflective film was provided on an amorphous carbon base member. A resist was provided on the aluminum film and was then patterned in substantially the same manner as that used to prepare Sample 1, whereby flat sections 3 and protruding portions 4 were prepared. A scintillator material containing CsI:Tl was deposited on the flat sections 3 and the protruding portions 4, whereby first columnar scintillators 6 and second columnar scintillators 7 were formed on the flat sections 3 and the protruding portions 4, respectively. The first and second columnar scintillators 6 and 7 were attached to a substrate 1 having two-dimensionally arrayed photodetecting elements 2 made of amorphous silicon. In this step, the first and second columnar scintillators 6 and 7 shown in FIG. 3 were attached to the substrate 1 such that the first columnar scintillators 6 were arranged on the photodetecting elements 2. Through the above steps, the radiation-detecting device could be manufactured without damaging any scintillator. The radiation-detecting device included the first and second columnar scintillators 6 and 7. The first columnar scintillators 6 were each located at a position overlapping with a corresponding one of the photodetecting elements 2. The second columnar scintillators 7 were located between the neighboring first columnar scintillators 6 and were spaced from the first columnar scintillators 6 adjacent thereto.

In the case of using steps of preparing Sample 2, the first and second columnar scintillators 6 and 7 shown in FIG. 5 may be attached to the substrate 1 such that the first columnar scintillators 6 disposed on the flat sections 3 are located at the positions overlapping with the photodetecting elements 2.

A step of preparing the substrate 1 is not limited to a treatment of forming the uneven section and the flat sections 3 on the base member 12 as described in each of the above examples and samples or a treatment of forming the uneven section and the flat sections 3 by processing the base member 12 and may be, for example, an operation for providing the substrate 1 having the uneven section and the flat sections 3 on a stage for the deposition of the scintillator material.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-88795 filed Apr. 7, 2010, which is hereby incorporated by reference herein in its entirety.

What is claimed is:

1. A method of manufacturing a radiation-detecting device that includes a substrate including a plurality of first columnar scintillators spaced from each other and a plurality of second columnar scintillators which are located between the neighboring first columnar scintillators and which are spaced from the first columnar scintillators adjacent thereto and also includes a plurality of photodetecting elements each located at a position overlapping with a corresponding one of the first columnar scintillators, the method comprising:

a step of preparing the substrate such that the substrate has a surface having an uneven section having protruding portions and a plurality of flat sections which are surrounded by the uneven section and which are spaced from each other; and a step of forming the first columnar scintillators and the second columnar scintillators on the flat sections and the protruding portions, respectively, by depositing a scintillator material on the substrate having the uneven section and the flat sections, wherein the uneven section has recessed portions and satisfies the following inequality:

$$h/d \geq 1$$

where h is the depth of each recessed portion and d is the distance between the protruding portions.

2. The method according to claim 1, wherein the distance d between the protruding portions ranges from 2 μm to 10 μm and a periodicity of the protruding portions is 5 μm to 15 μm.

3. The method according to claim 1, wherein the flat sections have an area equal to or greater than the area of each photodetecting element.

4. The method according to claim 1, wherein the protruding portions are located between the neighboring flat sections and are alternately arranged.

5. A radiation-detecting device comprising:

a substrate including a plurality of first columnar scintillators spaced from each other and a plurality of second columnar scintillators which are located between the first columnar scintillators and which are spaced from the first columnar scintillators adjacent thereto; and a plurality of photodetecting elements each located at a position overlapping with a corresponding one of the first columnar scintillators, wherein the substrate has a surface having an uneven section having recessed portions and protruding portions and a plurality of flat sections which are surrounded by the uneven section and which are spaced from each other, the first columnar scintillators are located on the flat sections, the second columnar scintillators are located on the protruding portions, and the uneven section satisfies the following inequality:

$$h/d \geq 1$$

where h is the depth of each recessed portion and d is the distance between the protruding portions.

6. A method of manufacturing a radiation-detecting device comprising:

patterning a surface of a substrate to form a plurality of flat sections each surrounded by an uneven section, the uneven section including a plurality of protruding portions disposed between the flat sections;

forming first columnar scintillators on the flat sections and forming second columnar scintillators on the protruding portions, respectively, by depositing a scintillator material on the surface of the substrate having the uneven section and the flat sections, wherein a height h of each protruding portion and a distance d between the protruding portions satisfy the inequality $h/d \geq 1$; and attaching a plurality of photodetecting elements in a one-to-one correspondence with the first columnar scintillators, wherein the first columnar scintillators convert radiation incident thereupon into scintillating light and guide the scintillating light towards the photodetecting elements, and wherein the second columnar scintillators are disposed so as to prevent travel of leakage scintillating light from a certain photodecting element to neighboring photodetecting elements.

* * * * *